(12) United States Patent
Okuno et al.

(10) Patent No.: US 8,980,797 B2
(45) Date of Patent: Mar. 17, 2015

(54) METHOD OF MANUFACTURING BASE MATERIAL FOR SUPERCONDUCTING CONDUCTOR, METHOD OF MANUFACTURING SUPERCONDUCTING CONDUCTOR, BASE MATERIAL FOR SUPERCONDUCTING CONDUCTOR, AND SUPERCONDUCTING CONDUCTOR

(75) Inventors: Yoshikazu Okuno, Tokyo (JP); Hiroyuki Fukushima, Tokyo (JP); Yuko Hayase, Tokyo (JP); Eiji Kojima, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 25 days.

(21) Appl. No.: 13/814,085

(22) PCT Filed: Aug. 24, 2012

(86) PCT No.: PCT/JP2012/071506
§ 371 (c)(1),
(2), (4) Date: Feb. 4, 2013

(87) PCT Pub. No.: WO2013/027839
PCT Pub. Date: Feb. 28, 2013

(65) Prior Publication Data
US 2013/0190188 A1    Jul. 25, 2013

(30) Foreign Application Priority Data

Aug. 24, 2011 (JP) ................... 2011-182674

(51) Int. Cl.
*H01B 12/02* (2006.01)
*H01B 12/06* (2006.01)
(Continued)

(52) U.S. Cl.
CPC .............. *H01B 12/02* (2013.01); *C23C 14/082* (2013.01); *C23C 14/083* (2013.01); *C23C 14/3442* (2013.01); *C23C 14/562* (2013.01); *H01L 39/2461* (2013.01); *Y10S 505/704* (2013.01)
USPC ........... 505/237; 505/239; 505/434; 505/470; 505/704; 428/469; 428/701; 427/62; 427/126.6; 427/595; 174/125.1

(58) Field of Classification Search
CPC .......... H01L 39/2454; H01L 39/2458; H01L 39/2461; H01B 12/06; C23C 14/00; C23C 14/06; C23C 14/34; C23C 14/46; C23C 14/562; C23C 14/3442; C23C 14/08; C23C 14/083
USPC .......... 505/236–239, 434, 470, 704; 428/472, 428/701, 702; 427/62, 126.6, 595, 596; 174/125.1
See application file for complete search history.

(56) References Cited

U.S. PATENT DOCUMENTS

| | | | |
|---|---|---|---|
| 4,994,435 A * | 2/1991 | Shiga et al. | 505/232 |
| 6,624,122 B1 | 9/2003 | Holesinger et al. | |

(Continued)

FOREIGN PATENT DOCUMENTS

| | | |
|---|---|---|
| JP | 64 52329 | 2/1989 |
| JP | 2004 501493 | 1/2004 |

(Continued)

OTHER PUBLICATIONS

U.S. Appl. No. 13/814,580, filed Feb. 6, 2013, Hayase, et al.
(Continued)

*Primary Examiner* — Colleen Dunn
*Assistant Examiner* — Kallambella Vijayakumar
(74) *Attorney, Agent, or Firm* — Oblon, McClelland, Maier & Neustadt, L.L.P.

(57) ABSTRACT

A method for manufacturing a base material 2 for a superconductive conductor which includes: a conductive bed layer forming process of forming a non-oriented bed layer 24 having conductivity on a substrate 10; and a biaxially oriented layer forming process of forming a biaxially oriented layer 26 on the bed layer 24.

18 Claims, 2 Drawing Sheets

(51) Int. Cl.
*H01L 39/24* (2006.01)
*C23C 14/08* (2006.01)
*C23C 14/34* (2006.01)
*C23C 14/56* (2006.01)

(56) References Cited

U.S. PATENT DOCUMENTS

| | | |
|---|---|---|
| 6,921,741 B2 | 7/2005 | Arendt et al. |
| 2001/0056041 A1 | 12/2001 | Jia et al. |
| 2003/0144150 A1* | 7/2003 | Arendt et al. ............... 505/237 |
| 2005/0217568 A1* | 10/2005 | Rupich et al. ............... 117/101 |
| 2010/0022396 A1 | 1/2010 | Otto et al. |
| 2011/0105336 A1* | 5/2011 | Takahashi et al. .......... 505/230 |
| 2012/0178630 A1 | 7/2012 | Okuno |

FOREIGN PATENT DOCUMENTS

| | | |
|---|---|---|
| JP | 2008 303082 | 12/2008 |
| JP | 2010 123475 | 6/2010 |
| JP | 2011 96509 | 5/2011 |
| JP | 2011 96566 | 5/2011 |
| WO | 2010 011739 | 1/2010 |

OTHER PUBLICATIONS

U.S. Appl. No. 13/814,160, filed Feb. 4, 2013, Hayase, et al.
International Search Report Issued Oct. 2, 2012 in PCT/JP12/071506 Filed Aug. 24, 2012.

* cited by examiner

METHOD OF MANUFACTURING BASE MATERIAL FOR SUPERCONDUCTING CONDUCTOR, METHOD OF MANUFACTURING SUPERCONDUCTING CONDUCTOR, BASE MATERIAL FOR SUPERCONDUCTING CONDUCTOR, AND SUPERCONDUCTING CONDUCTOR

TECHNICAL FIELD

The present invention relates to a method for manufacturing a superconductive conductor used for a superconducting cable, a superconducting magnet and the like and a superconductive conductor, and a method for manufacturing a base material for a superconductive conductor, which is used for the superconductive conductor, and a base material for a superconductive conductor.

BACKGROUND ART

Many attempts have been conventionally proposed to manufacture a superconductive conductor by depositing a superconducting layer on a base material.

Energization characteristics of a high-temperature superconductive conductor are known to significantly depend on crystallographic orientation of the superconductor, particular biaxial orientation, particularly on biaxial orientation thereof. In order to obtain a superconducting layer having high biaxial orientation, crystallinity of an intermediate layer as an underlying substance is desired to be improved.

For example, Japanese Patent Application Laid-Open (JP-A) No. 2008-303082 discloses an oriented substrate for forming an epitaxial film, in which an intermediate layer which is provided between the oriented substrate and an epitaxial film formed on at least one surface of the oriented substrate has a multilayer structure of two layers or more, a layer which contacts the substrate is made of indium tin oxide, and, on the indium tin oxide layer, a layer made of nickel, nickel oxide, zirconium oxide, a rare earth oxide, magnesium oxide, strontium titanate, strontium-barium titanate, titanium nitride, silver, palladium, gold, iridium, ruthenium, rhodium, or platinum is used in parallel.

Further, U.S. Pat. No. 6,921,741 discloses a base material for a superconductor which has an MgO layer, which is an intermediate layer formed over a substrate by an IBAD (Ion Beam Assisted Deposition) method (hereinafter, referred to as IBAD-MgO layer), and a material such as $CeO_2$, YSZ, $SrTiO_3$, $SrRuO_3$, $LaMnO_3$, $Y_2O_3$, $Eu_2CuO_4$, $Nd_2CuO_4$, $Y_2CuO_4$, or $RE_2CuO_4$ are used in parallel on an epitaxially-grown MgO layer formed on the IBAD-MgO layer.

SUMMARY OF INVENTION

Technical Problem to be Solved

However, when indium tin oxide is used as disclosed in JP-A No. 2008-303082, there is a problem that it is difficult to obtain excellent biaxial orientation. Moreover, since indium tin oxide needs to be formed to be thick to be about 350 nm, there is a problem that manufacturing cost is increased.

In addition, in a case in which the conductive intermediate layer such as strontium ruthenium oxide is used on an insulating layer such as the epitaxially-grown MgO layer as disclosed in U.S. Pat. No. 6,921,741, there was a problem that a bed layer is locally peeled off due to occurrence of arcing in forming the IBAD-MgO layer and the epitaxially-grown MgO layer by a sputtering method before forming the strontium ruthenium oxide. As a result, there was a problem that, in a superconducting layer or the like formed thereon, the superconducting layer formed on the peeled bed layer cannot obtain excellent energization characteristics.

On the other hand, there was a problem that, in a case in which a non-oriented metal substrate is used as a substrate, in a biaxially oriented layer formed on the non-oriented substrate through an insulating bed layer (for example, $Gd_2Zr_2O_7$ (GZO)), the bed layer is locally peeled off due to occurrence of arcing (discharge) when depositing the biaxially oriented layer by a sputtering method. As a result, there was a problem that, in a superconducting layer or the like formed on the biaxially oriented layer, the superconducting layer formed on the peeled bed layer cannot obtain excellent energization characteristics.

The present invention has been made in view of the facts, and aims to provide a method for manufacturing a base material for a superconductive conductor by which a biaxially oriented layer having excellent biaxial orientation can be formed, and a base material for a superconductive conductor which includes a biaxially oriented layer having excellent biaxial orientation.

The present invention further aims to provide a superconductive conductor which has excellent energization characteristics, and a method for manufacturing the superconductive conductor.

Solution to Problem

The above-described problems were solved by the following means.

(1) A method for manufacturing a base material for a superconductive conductor, comprising: a conductive bed layer forming process of forming a non-oriented bed layer having conductivity on a substrate; and a biaxially oriented layer forming process of forming a biaxially oriented layer on the bed layer.

(2) The method for manufacturing a base material for a superconductive conductor according to (1), wherein the biaxially oriented layer forming process is a process of forming the biaxially oriented layer on the bed layer by using a sputtering method.

(3) The method for manufacturing a base material for a superconductive conductor according to (1) or (2), wherein the electrical resistivity of the bed layer is equal to or lower than $10^{-1}$ Ω·cm.

(4) The method for manufacturing a base material for a superconductive conductor according to any one of (1) to (3), wherein the electrical resistivity of the bed layer is equal to or lower than $10^{-2}$ Ω·cm.

(5) The method for manufacturing a base material for a superconductive conductor according to any one of (1) to (4), wherein the electrical resistivity of the bed layer is equal to or higher than $10^{-6}$ Ω·cm.

(6) The method for manufacturing a base material for a superconductive conductor according to any one of (1) to (5), wherein the bed layer forming process is a process of forming the bed layer by using at least one of $LiTi_2O_4$ or $SrRuO_3$.

(7) The method for manufacturing a base material for a superconductive conductor according to any one of (1) to (6), wherein the biaxially oriented layer forming process is a process of forming the biaxially oriented layer using MgO.

(8) A method for manufacturing a superconductive conductor, comprising a superconducting layer forming process of forming a superconducting layer on the biaxially oriented layer performed after the biaxially oriented layer forming process in the method for manufacturing a base material for a superconductive conductor according to (1).

(9) The method for manufacturing a superconductive conductor according to (8), further comprising an oriented layer forming process of forming at least one oriented layer on the biaxially oriented layer performed after the biaxially oriented layer forming process but before the superconducting layer forming process, wherein the superconducting layer forming process is a process of forming the superconducting layer on the oriented layer.

(10) A base material for a superconductive conductor, comprising: a substrate; a non-oriented bed layer having conductivity and being disposed on the substrate; and a biaxially oriented layer being disposed on the bed layer.

(11) The base material for a superconductive conductor according to (10), wherein the electrical resistivity of the bed layer is equal to or lower than $10^{-1}$ $\Omega \cdot cm$.

(12) The base material for a superconductive conductor according to (10) or (11), wherein the electrical resistivity of the bed layer is equal to or lower than $10^{-2}$ $\Omega \cdot cm$.

(13) The base material for a superconductive conductor according to any one of (10) to (12), wherein the electrical resistivity of the bed layer is equal to or higher than $10^{-6}$ $\Omega \cdot cm$.

(14) The base material for a superconductive conductor according to any one of (10) to (13), wherein the bed layer comprises at least one of $LiTi_2O_4$ or $SrRuO_3$.

(15) The base material for a superconductive conductor according to any one of (10) to (14), wherein the biaxially oriented layer comprises MgO.

(16) A superconductive conductor comprising a superconducting layer being disposed on the biaxially oriented layer in the base material for a superconductive conductor according to (10).

(17) The superconductive conductor according to (16), wherein at least one oriented layer is provided between the biaxially oriented layer and the superconducting layer.

Advantageous Effects of Invention

According to the present invention, a method for manufacturing a base material for a superconductive conductor, by which a biaxially oriented layer having excellent biaxial orientation can be formed, and a base material for a superconductive conductor, which includes a biaxially oriented layer having excellent biaxial orientation, are provided.

Moreover, a superconductive conductor which excels in energization characteristics, and a method for manufacturing the superconductive conductor are also provided.

DESCRIPTION OF EMBODIMENTS

Figure 1:
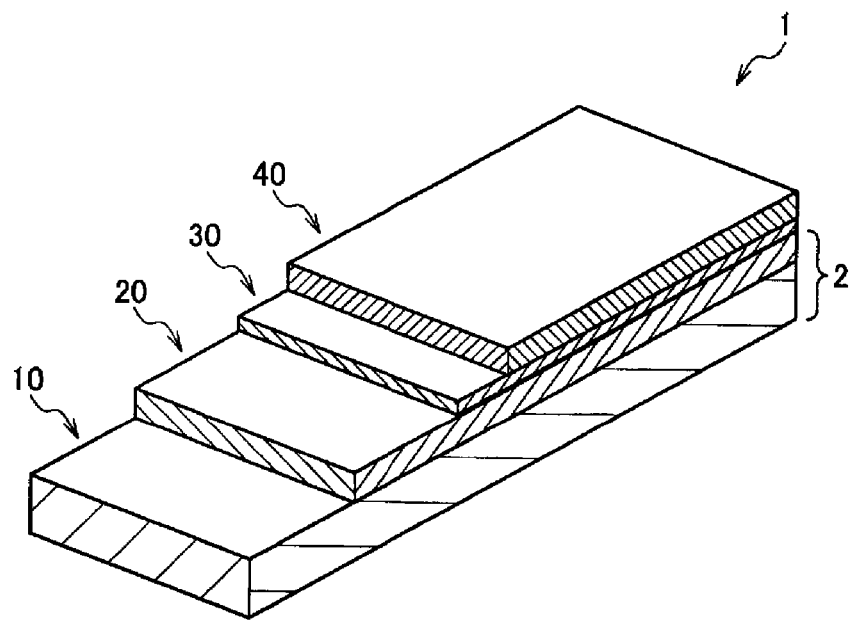
FIG. 1 is a diagram showing a layered structure of a superconductive conductor according to an embodiment of the present invention.

A method for manufacturing a base material for a superconductive conductor according to the present invention includes a conductive bed layer forming process of forming a non-oriented bed layer having conductivity on a substrate, and a biaxially oriented layer forming process of forming a biaxially oriented layer on the bed layer.

The biaxially oriented layer forming process is preferably a process of forming the biaxially oriented layer on the bed layer by a sputtering method, and is preferably a process of forming the biaxially oriented layer by sputtering target particles from a target by a sputtering method and making the sputtered target particles to be provided to form a layer on the bed layer.

Moreover, a base material for a superconductive conductor according to the present invention includes a substrate, a non-oriented bed layer having conductivity and being disposed on the substrate, and a biaxially oriented layer being disposed on the bed layer.

The biaxially oriented layer is preferably formed on the bed layer by using a sputtering method, and is preferably formed by sputtering target particles from a target by a sputtering method and making the sputtered target particles to be provided to form a layer on the bed layer.

Hereinafter, the base material for a superconductive conductor, the superconductive conductor, and the methods of manufacturing them according to embodiments of the present invention will be concretely explained with reference to the attached drawings. In the drawings, members (components) having the same or corresponding functions are denoted by the same reference numeral, and explanation thereof will be properly omitted.

(Structures of Base Material for Superconductive Conductor and Superconductive Conductor, and Methods of Manufacturing Them)

FIG. 1 is a diagram showing a layered structure of a superconductive conductor according to an embodiment of the present invention.

As shown in FIG. 1, a superconductive conductor 1 has a layered structure in which an intermediate layer 20, a superconducting layer 30, and a protection layer 40 are formed in this order on a tape-shaped substrate 10.

Substrate

Regarding a shape of the substrate 10, materials of various shapes such as lumber, a conductor, and a streak material may be used as well as the tape-shaped material.

Preferably, the substrate 10 is a non-oriented substrate in which at least a main surface on the side on which the intermediate layer 20 is deposited is made of a metal. The term of "non-oriented" means that microcrystal and/or crystal grains as structural units are not arranged in a given direction but are randomly arranged.

As a material for the substrate 10, for example, a metal which excels in strength and heat resistance, such as Cu, Ni, Ti, Mo, Nb, Ta, W, Mn, Fe, or Ag, or an alloy thereof may be used. Particularly preferable materials are stainless steel, HASTELLOY (registered trademark), and other nickel alloys, which are excellent in corrosion resistance and heat resistance. Moreover, various conductive ceramic materials may be arranged on the various metal materials.

Intermediate Layer

The intermediate layer 20 is a layer formed on the substrate 10 so as to achieve high in-plane orientation in the superconducting layer 30. Its physical characteristic values such as a coefficient of thermal expansion and a lattice constant indicate intermediate values between those of the substrate 10 and those of an oxide superconductor configurating the superconducting layer 30.

In the present embodiment, the intermediate layer 20 includes at least a bed layer having conductivity and a biaxially oriented layer.

Figure 3:
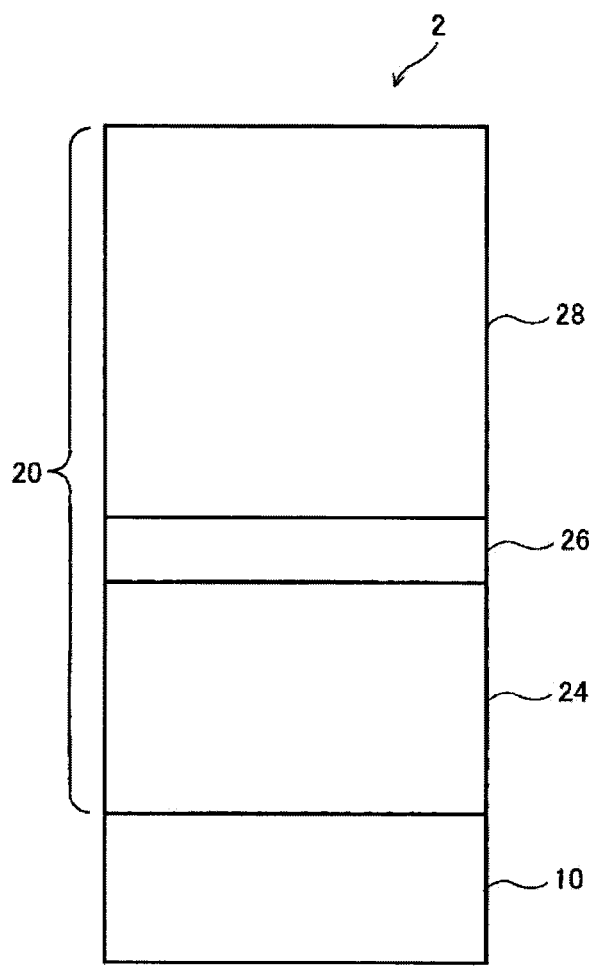
FIG. 3 is a detailed cross-sectional view of the layered structure of the superconductive conductor shown in FIG. 1.

FIG. 3 is a detailed cross-sectional view of the substrate 10 and the intermediate layer 20 in the layered structure of the superconductive conductor 1 shown in FIG. 1.

As shown in FIG. 3, the intermediate layer 20 of the superconductive conductor 1 is composed of a bed layer 24, a biaxially oriented layer 26, and another oriented layer 28.

(Bed Layer)

The bed layer 24 is a layer having conductivity, that is, a layer having electrical resistivity which is equal to or lower than $10^0$ Ω·cm. Preferably, the electrical resistivity is equal to or lower than $10^{-1}$ Ω·cm, and more preferably, the electrical resistivity is equal to or lower than $10^{-2}$ Ω·cm so as to efficiently suppress arcing. In addition, the electrical resistivity is preferably equal to or higher than $10^{-6}$ Ω·cm.

The electrical resistivity [Ωcm] can be obtained by measuring conductance by a direct current four-terminal method at room temperature.

The bed layer 24 is non-oriented. The term of "non-oriented" means that microcrystal and/or crystal grains as structural units are not arranged in a given direction but are randomly arranged. In terms of improving in-plane orientation of the biaxially oriented layer 26 formed on the bed layer 24, it is preferable that at least a surface of the bed layer 24 on the side of the biaxially oriented layer 26 be in an amorphous state.

Examples of a constituent material of the bed layer 24 are as follows. $LiTi_2O_4$ (spinel type, electrical conductivity $3.0 \times 10^1$, electrical resistivity $3.3 \times 10^{-2}$) $ReO_3$ (rhenium trioxide type, electrical conductivity $1.0 \times 10^5$, electrical resistivity $1.0 \times 10^{-5}$) $LaTiO_3$ (perovskite type, electrical conductivity $5.0 \times 10^2$, electrical resistivity $2.0 \times 10^{-3}$) $SrCrO_3$ (perovskite type, electrical conductivity $3.0 \times 10^3$, electrical resistivity $3.3 \times 10^{-4}$) $LaNiO_3$ (perovskite type, electrical conductivity $1.0 \times 10^3$, electrical resistivity $1.0 \times 10^{-3}$) $SrIrO_3$ (perovskite type, electrical conductivity $3.0 \times 10^2$, electrical resistivity $3.3 \times 10^{-3}$) $SrRuO_3$ (perovskite type, electrical conductivity $1.0 \times 10^3$ or higher, electrical resistivity $3.3 \times 10^{-3}$ or lower) $BaPbO_3$ (perovskite type, electrical conductivity $3.0 \times 10^3$, electrical resistivity $3.3 \times 10^{-4}$) TiO (NaCl type, electrical conductivity $3.0 \times 10^3$, electrical resistivity $3.3 \times 10^{-4}$) $MoO_2$ (rutile type, electrical conductivity $5.0 \times 10^3$, electrical resistivity $2.0 \times 10^{-4}$) $WO_2$ (rutile type, electrical conductivity $3.0 \times 10^2$, electrical resistivity $3.3 \times 10^{-3}$) $\beta\text{-}ReO_2$ (rutile type, electrical conductivity $1.0 \times 10^4$, electrical resistivity $1.0 \times 10^{-4}$) $RuO_2$ (rutile type, electrical conductivity $3.0 \times 10^4$, electrical resistivity $3.3 \times 10^{-5}$) $Pb_2Ru_2O_{7-X}$ (pyrochlore type, electrical conductivity $2.0 \times 10^3$, electrical resistivity $5.0 \times 10^{-4}$) $Bi_2Ru_2O_{7-X}$ (pyrochlore type, electrical conductivity $1.0 \times 10^3$, electrical resistivity $1.0 \times 10^{-3}$)

Among them, it is preferable that the bed layer 24 contain at least one of $LiTi_2O_4$ or $SrRuO_3$ because biaxial orientation of the biaxially oriented layer formed thereon is improved.

A film thickness of the bed layer 24 is not specifically limited, but, for example, it is from 10 nm to 200 nm.

(Bed Layer Forming Process)

Examples of a method for forming (depositing) the bed layer 24 include a deposition method by an RF sputtering method.

In the RF sputtering method, inert gas ions (for example, $Ar^+$) generated by plasma discharge are collided with an evaporation source ($LiTi_2O_4$ or the like) and sputtered evaporated particles are made to be deposited on a deposition area to form a film. Although deposition conditions therefor are arbitrarily set based on the constituent material, the film thickness and the like of the bed layer 24, for example, RF sputtering output is set within the range of from 100 W to 500 W, a substrate transporting speed is set within the range of from 10 m/h to 100 m/h, and a deposition temperature is set within the range of from 20° C. to 500° C.

An ion-beam sputtering method for colliding ions generated by an ion generator (ion gun) with an evaporation source may be used for deposition of the bed layer 24.

The bed layer 24 is formed as a non-oriented film by, for example, being formed on the non-oriented substrate 10 by the above method, but a method for making the bed layer 24 as being a non-oriented layer is not limited thereto.

Preferably, the bed layer 24 is in direct contact with the substrate 10. The expression of being in direct contact with the substrate means that the bed layer 24 is deposited on a surface (main surface side) of the substrate 10. The surface of the substrate 10, at least the surface of which is made of a metal, is naturally oxidized in the atmosphere, and an infinitely-thin oxidized film derived from a metal contained in the substrate 10 is formed. The oxidized film is called a passive film. The bed layer 24 may be in contact with the passive film derived from the metal contained in the substrate 10.

(Biaxially Oriented Layer)

The biaxially oriented layer 26 is a layer formed on the bed layer 24, and is a layer for orienting crystals in the superconducting layer 30 in a given direction.

Examples of a constituent material of the biaxially oriented layer 26 include a polycrystalline material such as MgO, $CeO_2$, YSZ, or NbO. Among them, it is preferable that the biaxially oriented layer 26 contain MgO.

A film thickness of the biaxially oriented layer 26 is not specifically limited, but, for example, it is from 1 nm to 20 nm.

(Biaxially Oriented Layer Forming Process)

As a method for forming (depositing) the biaxially oriented layer 26, it is preferable to use a method in which target particles are sputtered from a target (evaporation source) by a sputtering method and the sputtered target particles are made to be provided to form a layer on the bed layer 24. In addition, it is particularly preferable to use a sputtering method (IBAD method) in which target particles from a target are made to be deposited on a deposition area while irradiating the deposition area with an ion beam from a direction which is oblique with respect to the deposition area to form a film.

Figure 2:
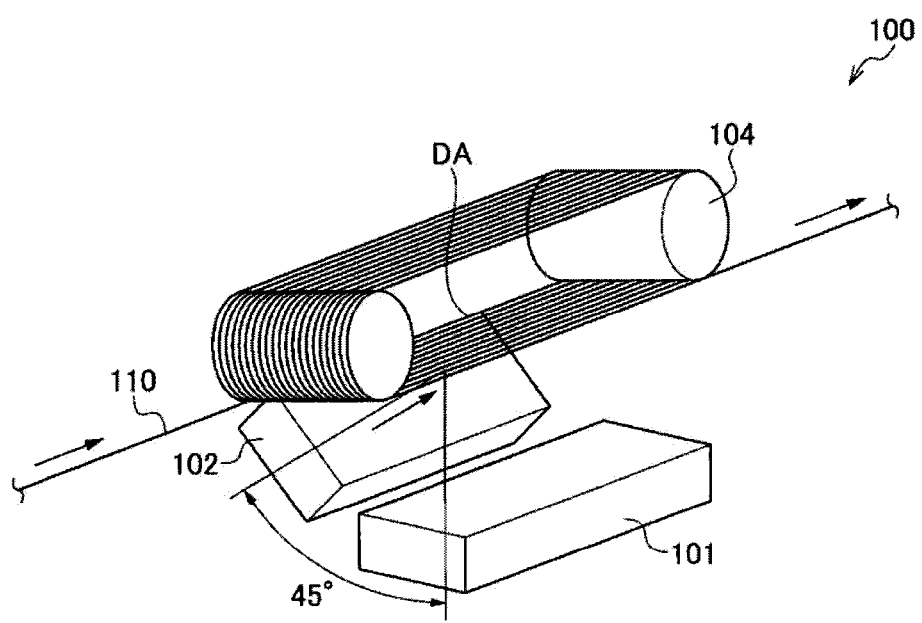
FIG. 2 is a schematic diagram for explaining a deposition method by an IBAD method.

FIG. 2 is a diagram showing a schematic structure of a sputtering device used when the IBAD method is applied. As shown in FIG. 2, a sputtering device 100 is composed of a sputter gun 101 having a target (evaporation source) therein, an assisting ion source 102, and a substrate transporting part 104. The sputtering device 100 is housed in a vacuum container (not shown in diagram by abbreviation), and is configured such that evaporated particles can be deposited on a deposition area DA in vacuum. The sputtering device 100 further includes a heater, which is not shown in the diagram, so that the deposition area DA can be heated to a desired temperature.

When the biaxially oriented layer 26 is deposited, the tape-shaped substrate 10 on which the bed layer 24 is formed is provided as a substrate 110 and is transported into the sputtering device by the substrate transporting part 104.

The sputter gun 101 is a device in which the target (evaporation source) is provided inside and inert gas ions (for example, $Ar^+$) are generated by high-frequency plasma (RF plasma) so as to sputter evaporated particles from the target by collision of the ions. In addition, the assisting ion source 102 includes an ion gun which accelerates and releases ions generated by an ion generator so that the deposition area DA can be irradiated with desired ions.

The evaporated particles sputtered from the target of the sputter gun 101 are deposited on the deposition area DA of the substrate 110 which is opposed to the target to form a polycrystalline thin film. At this time, the deposition area of the substrate 110 is irradiated with an assisting ion beam from an oblique direction (for example, 45° with respect to the normal direction to the deposition area) by the assisting ion source 102. As a result thereof, formation of vacancies in the polycrystalline thin film formed on the deposition area DA of the substrate 110 is suppressed, and the dense biaxially oriented layer 26 is deposited.

An angle of the oblique direction of the ion beam with which the deposition area DA is irradiated is preferably in the range of from 10° to 80°, more preferably from 40° to 50°, and particularly preferably approximately 45°, with respect to the normal direction to the deposition area.

The deposition condition is arbitrarily set based on the constituent material, the film thickness and the like of the biaxially oriented layer 26, and for example, it is preferably set to include an assisting ion beam voltage in IBAD of from 800 V to 1500 V, an assisting ion beam current in IBAD of from 80 mA to 350 mA, an assisting ion beam accelerating voltage in IBAD of 200 V, RF sputtering output of from 800 W to 1500 W, a substrate transporting speed of from 60 m/h to 500 m/h, and a deposition temperature of from 5° C. to 250° C.

When the RF sputtering output is high as the deposition condition, a film property (degree of in-plane orientation $\Delta\phi$) of the biaxially oriented layer is improved, and therefore, it is preferable that the RF sputtering output be equal to or higher than 1000 W.

(Another Oriented Layer)

The present embodiment may further include another oriented layer 28 provided on the biaxially oriented layer 26. The oriented layer 28 is a layer formed on the biaxially oriented layer 26, and is directed to protect the biaxially oriented layer 26 and also to improve lattice matching with the superconducting layer 30.

Examples of a material of the oriented layer 28 include $LaMnO_3$ (LMO), $CeO_2$, MgO, YSZ, and $SrTiO_3$ (STO).

The oriented layer 28 may be formed of a single layer or multiple layers which includes two or more layers.

A film thickness of the oriented layer 28 is not specifically limited, while the film thickness thereof is preferably 50 nm or more, and more preferably 300 nm or more, in view of obtaining sufficient orientation.

(Oriented Layer Forming Process)

Examples of a method for forming (depositing) the oriented layer 28 include a deposition by a PLD method or an RF sputtering method. A deposition condition by the RF sputtering method is arbitrarily set based on the constituent material, the film thickness and the like of the oriented layer 28, and for example, the deposition condition is preferably set to include an RF sputtering output of from 400 W to 1000 W, a substrate transporting speed of from 2 m/h to 50 m/h, and a deposition temperature of from 450° C. to 900° C.

Superconducting Layer

Next, the superconductive conductor and the method for manufacturing the same according to the present embodiment will be described. The superconducting layer 30 is formed on a base material 2 for a superconductive conductor according to the present embodiment.

Preferably, the superconducting layer 30 is formed on the intermediate layer 20 and is composed of an oxide superconductor, particularly a copper oxide superconductor. As the copper oxide superconductor, a crystalline material represented by a composition formula such as $REBa_2Cu_3O_{7-\delta}$ (referred to as RE-123) may be used.

RE in the $REBa_2Cu_3O_{7-\delta}$ is a single rare earth element or plural rare earth elements such as Y, Nd, Sm, Eu, Gd, Dy, Ho, Er, Tm, Yb, or Lu. Among them, Y is often used. $\delta$ represents an oxygen non-stoichiometric amount, and is, for example, from 0 to 1. In terms of obtaining a high superconducting transition temperature, the value of $\delta$ nearer to 0 is preferable.

A film thickness of the superconducting layer 30 is not specifically limited. For example, it is from 0.8 μm to 10 μm.

(Superconducting Layer Forming Process)

Examples of a method for forming (depositing) the superconducting layer 30 include a TFA-MOD method, a PLD method, a CVD method, an MOCVD method, and a sputtering method. Among these deposition methods, the MOCVD method is preferable because it does not require high vacuum and it has excellent mass productivity due to easiness in application for large area. A deposition condition when using the MOCVD method is arbitrarily set based on the constituent material. For example, the film thickness and the like of the superconducting layer 30 preferably includes a substrate transporting speed of from 1 m/h to 50 m/h and a deposition temperature of from 700° C. to 900° C. In addition, the deposition is preferably carried out in an oxygen gas atmosphere in terms of reducing the oxygen non-stoichiometric amount $\delta$ to improve superconducting properties.

Protection Layer

A protection layer (stabilized layer) 40 made of silver may be deposited on an upper surface of the superconducting layer 30 by, for example, a sputtering method. Moreover, after manufacturing the superconductive conductor 1 by depositing the protection layer 40, the superconductive conductor 1 may be subjected to heat treatment.

(Modifications)

Although the specific embodiments have been described in detail, the present invention in not limited thereto. It will be obvious to those skilled in the art that other various embodiments are possible without departing from the scope of the invention. For example, the above-described plural embodiments may be appropriately combined with each other to implement the invention. In addition, the following modifications may be appropriately combined with each other.

For example, another oriented layer 28 may be omitted.

In addition, although the case in which the oxygen non-stoichiometric amount $\delta$ of the material such as $YBa_2Cu_3O_{7-\delta}$ is 0 or larger (case of indicating positive value) has been described, the value may be negative.

(Effects)

Conventionally, in the case in which a non-oriented material is used for a bed layer of a base material for a superconductive conductor which includes a substrate, the bed layer, and a biaxially oriented layer, deposition conditions and the like needed to be strictly controlled to obtain excellent biaxial orientation, compared to the case in which a biaxially oriented material is used for the bed layer. This is because the biaxially oriented layer formed on the non-oriented bed layer was required to obtain a biaxially oriented material on a non-oriented layer. However, there was a problem that since dust in the atmosphere, minute powder generated when forming a bed layer, a biaxially oriented layer or the like (for example, powder generated due to friction between a substrate and a reel or the like) and the like adhere to a surface of the bed layer, excellent biaxial orientation cannot be obtained when the biaxially oriented layer is formed on the bed layer to which the dust or the like adheres, and the biaxially oriented layer cannot obtain uniform properties as a whole. As a result, there was a problem that a superconducting layer or the like formed on the biaxially oriented layer cannot obtain excellent properties.

Orientation of the biaxially oriented layer formed on the bed layer becomes better when microcrystalline and/or amorphous material (non-oriented material) is used for the bed layer than when a crystalline material (oriented crystal) is used.

In the case in which an oriented material is used for a bed layer, excellent biaxial orientation can be obtained without strictly controlling deposition conditions and the like when forming a biaxially oriented layer on the oriented bed layer, and thus, the problem due to adhesion of the dust or the like to the surface of the bed layer is not thought to occur.

The problem is caused when an insulating material (having electrical resistivity of higher than $10^6$ $\Omega \cdot cm$) is used for a bed layer. It is thought that this is because the dust or the like adheres to the surface of the bed layer and the adherent dust or the like is difficult to be separated therefrom due to electrification of the bed layer.

In contrast, the base material for a superconductive conductor of the present embodiment includes a substrate, a non-oriented bed layer having conductivity on the substrate, and a biaxially oriented layer on the bed layer. Moreover, a method for manufacturing a base material for a superconductive conductor of the present embodiment includes a conductive bed layer forming process of forming a non-oriented bed layer having conductivity on a substrate and a biaxially oriented layer forming process of forming a biaxially oriented layer on the bed layer. That is, since a conductive material (having electrical resistivity of equal to or lower than $10^0$ $\Omega \cdot cm$) is formed as the bed layer, it is thought that electrification of the bed layer and adhesion of the dust or the like to the surface of the bed layer are suppressed, and thus, the biaxially oriented layer which has excellent biaxial orientation can be obtained. Further, it is thought that the biaxially oriented layer can obtain uniform properties as a whole, and the superconducting layer formed on the biaxially oriented layer can obtain excellent energization characteristics.

In addition, when a biaxially oriented layer of a base material for a superconductive conductor, which includes a substrate, a bed layer, and the biaxially oriented layer, is formed by sputtering target particles from a target by a sputtering method and making the sputtered target particles to be provided on the bed layer, there were cases in which arcing (discharge) occurs in forming the biaxially oriented layer. An intermediate layer such as the bed layer or the biaxially oriented layer was peeled off from the substrate due to the occurrence of arcing. Even if a superconducting layer or the like is formed on the peeled part in a succeeding process, the superconducting layer could not obtain excellent orientation, thereby leading to inferior energization characteristics. Further, when the intermediate layer is peeled across the substrate by arcing, there were cases in which a critical current becomes zero.

When sputtering output in performing sputtering is increased, a film property (degree of in-plane orientation $\Delta\phi$) of the biaxially oriented layer tends to increase. However, by increasing the sputtering output, arcing occurs notably. On the other hand, when the sputtering output in performing sputtering is low, occurrence of arcing can be suppressed. However, the film property (degree of in-plane orientation $\Delta\phi$) of the biaxially oriented layer is not excellent, and thus, the superconducting layer formed on the biaxially oriented layer cannot obtain excellent critical current properties.

In the case in which the biaxially oriented layer is formed by a method other than the sputtering method, arcing does not occur, and thus, the problem such as peel-off of the intermediate layer from the substrate is not thought to occur.

The problem is caused when an insulating material (having electrical resistivity of higher than $10^6$ $\Omega \cdot cm$) is used for a bed layer. It is thought that this is because the substrate does not fall to zero potential in sputtering and arcing occurs on the surface of the substrate.

In contrast, the base material for a superconductive conductor of the present embodiment includes a substrate, a non-oriented bed layer having conductivity and being disposed on the substrate, and a biaxially oriented layer on the conductive bed layer, and the biaxially oriented layer is formed by using a sputtering method. Moreover, the method for manufacturing a base material for a superconductive conductor of the present embodiment includes a conductive bed layer forming process of forming a non-oriented bed layer having conductivity on a substrate and a biaxially oriented layer forming process of forming a biaxially oriented layer on the bed layer, and the biaxially oriented layer forming process is a process of forming the biaxially oriented layer by a sputtering method. That is, since a conductive material (having electrical of resistivity equal to or lower than $10^0$ $\Omega \cdot cm$) is formed as the bed layer, it is thought that the substrate falls to zero potential in sputtering, and thus, occurrence of arcing is suppressed. Further, it is thought that peel-off of the intermediate layer such as the bed layer or the biaxially oriented layer from the substrate due to arcing is suppressed, and the superconducting layer to be formed in a succeeding process can obtain excellent orientation and energization characteristics.

If an insulating layer is provided between the substrate and the conductive bed layer, the substrate does not fall to zero potential in sputtering, and thus, occurrence of arcing is not suppressed. Therefore, it is preferable that an insulating layer (having electrical resistivity of higher than $10^6$ $\Omega \cdot cm$) does not exist between the substrate and the conductive bed layer, and that the bed layer be in direct contact with the substrate.

The disclosure of Japanese Patent Application No. 2011-182674 is incorporated by reference herein in its entirety.

All the literature, patent applications and technical standards described in the present specification are incorporated by reference herein to the same extent as in cases where each literature, patent application or technical standard is concretely and individually described to be incorporated by reference.

EXAMPLES

Hereinafter, examples and a comparative example will be described. However, the present invention is not limited to the following examples.

Example 1

Formation of Bed Layer

A Ni-based alloy wire rod (HASTELLOY (registered trademark), non-oriented substrate) was introduced into a sputtering device, and the sputtering device was vacuumed to $1\times10^{-3}$ Pa. Then, an amorphous and non-oriented bed layer made of $LiTi_2O_4$ was deposited directly on the Ni-based alloy wire rod by an RF sputtering method with the use of $LiTi_2O_4$ as an evaporation source at room temperature. The bed layer having a thickness of 100 nm was obtained by adjusting a wire rod transporting speed to be 50 m/h. An RF sputtering output employed herein was set to be 300 W.

Formation of Biaxially Oriented Layer

Next, the wire rod on which the bed layer is formed was introduced into an IBAD device, and the IBAD device was vacuumed to $1\times10^{-3}$ Pa. Then, with the use of Mg as a target (evaporation source), target particles are sputtered from the Mg target by an RF sputtering method in an Ar—$O_2$ mixed gas atmosphere, an enforced biaxially oriented layer made of MgO was formed by an IBAD method in which the bed layer is irradiated with Ar ions by using ion-beam sputtering with forming a MgO film on the bed layer by reactive sputtering. The enforced biaxially oriented MgO layer was manufactured at room temperature. In this case, a wire rod transporting speed was set to be 80 m/h, RF sputtering output was set to be 1300 W, a beam current value was set to be 200 mA, a beam voltage was set to be 1000 V, and an accelerating voltage of assisting ion-beam sputtering were set to be 200V.

Formation of Another Oriented Layer

Next, the wire rod on which the bed layer and the enforced biaxially oriented layer are formed was introduced into a sputtering device, and the sputtering device was vacuumed to $1\times10^{-3}$ Pa. Then, a biaxially oriented layer made of $LaMnO_3$ was deposited by a sputtering method with the use of $LaMnO_3$ as an evaporation source at a temperature of 900° C. and a wire rod transporting speed of 60 m/h.

Further, the wire rod was introduced into a sputtering device, and the sputtering device was vacuumed to $1\times10^{-3}$ Pa. Then, a biaxially oriented layer made of $CeO_2$ was deposited by a sputtering method with the use of $CeO_2$ as an evaporation source at a temperature of 700° C. and a wire rod transporting speed of 3 m/h to obtain a tape base material for a superconducting wire rod.

Formation of Superconducting Layer and Stabilized Layer $YGdBa_2Cu_3O_{7-d}$ superconducting layer was deposited on the tape base material for a superconducting wire rod by an MOCVD method, and further, an Ag layer as a stabilized layer was deposited to obtain a superconducting wire rod.

Example 2

A tape base material for a superconducting wire rod was formed and a superconducting wire rod was obtained by the same method with Example 1, except that the evaporation source in the formation of the bed layer of Example 1 was changed to $SrRuO_3$.

Comparative Example 1

A tape base material for a superconducting wire rod was formed and a superconducting wire rod was obtained by the same method with Example 1, except that the evaporation source in the formation of the bed layer of Example 1 was changed to $Gd_2Zr_2O_7$.

[Evaluation]

Measurement of Electrical Resistivity of Bed Layer

Electrical resistivity [Ωcm] of the bed layer formed in each of the examples and the comparative example was obtained by measuring conductance by a direct current four-terminal method at room temperature after forming the bed layer on the Ni-based alloy wire rod and before forming the enforced biaxially oriented layer. The results are shown in the following Table 1.

Evaluation of Adherence of Dust or the like to Surface of Bed Layer

Presence or absence of dust in the atmosphere or minute powder generated when forming the bed layer, the biaxially oriented layer or the like adheres to the surface of the bed layer in forming the enforced biaxially oriented layer of each of the examples and the comparative example was observed by taking 1 cm-squares SEM images at three points, and was evaluated according to the following evaluation standards. The results are shown in the following Table 1.

A: no adhesion was observed in any of the three points

B: adhesion was observed in at least one point

Evaluation of Biaxial orientation of Another Oriented Layer ($CeO_2$ Layer)

It is difficult to directly measure biaxial orientation of the enforced biaxially oriented layer because of its small thickness. Accordingly, biaxial orientation of a $CeO_2$ layer, which correlates the biaxial orientation of the enforced biaxially oriented layer, was evaluated as an index thereof by the following method with respect to each of the examples and the comparative example. The results are shown in the following Table 1.

—Evaluation Method for Biaxial Orientation—

An average value of half-value widths of peaks every 90° obtained from $CeO_2$ (111) pole figure of X-ray diffraction measurement was evaluated as degree of in-plane orientation ($\Delta\phi$).

A: $\Delta\phi$ smaller than 4°

B: $\Delta\phi$ equal to or larger than 4°, and smaller than 6°

C: $\Delta\phi$ equal to or larger than 6°

Occurrence or Absence of Arcing

Whether or not arcing (discharge) occurred on the wire rod in forming the enforced biaxially oriented layer of each of the examples and the comparative example was evaluated by presence or absence of an arcing signature, and further, whether peel-off of the intermediate layer such as the bed layer or the enforced biaxially oriented layer is generated on the wire rod was observed. These were evaluated according to the following evaluation standards. The results are shown in the following Table 2.

Present: an arcing signature was observed, and a part of the intermediate layer of the wire rod was peeled off.

Absent: no arcing signature was observed, and t the intermediate layer of the wire rod had no part which was peeled off Measurement of Critical Current Ic A critical current Ic of the superconducting wire rod obtained from each of the examples and the comparative example was measured by the following method, and was evaluated according to the following evaluation standards. The results are shown in the following Table 1 and Table 2.

—Measurement Method for Critical Current Ic—

The critical current was measured by a four-terminal method in liquid nitrogen at a voltage definition of 1 μV/cm. A distance between voltage terminals was set to be 1 m length.

A: 300 A or more

B: 200 A or more but less than 300 A

C: less than 200 A

TABLE 1

| | Substrate | | Bed Layer | | Electrical Resistivity | Evaluation | | |
|---|---|---|---|---|---|---|---|---|
| | Material | Orientation | Material | Orientation | [Ω·cm] | Adherence of dust or the like | Biaxial orientation | Ic [1 m-length] |
| Example 1 | HASTELLOY | non-oriented | $LiTi_2O_4$ | non-oriented | $3.5 \times 10^{-2}$ (conductive) | A | A | A |
| Example 2 | HASTELLOY | non-oriented | $SrRuO_3$ | non-oriented | $1.0 \times 10^{-4}$ or less (conductive) | A | A | A |
| Comparative Example 1 | HASTELLOY | non-oriented | $Gd_2Zr_2O_7$ | non-oriented | more than $1.0 \times 10^6$ (insulating) | B | B | B |

TABLE 2

| | Bed Layer | | Evaluation | |
|---|---|---|---|---|
| | Material | Electrical Resistivity [Ω·cm] | Occurrence or Absence of Arcing | Ic [1 m length] |
| Example 1 | $LiTi_2O_4$ | $3.5 \times 10^{-2}$ (conductive) | Absent | A |
| Example 2 | $SrRuO_3$ | $1.0 \times 10^{-4}$ or less (conductive) | Absent | A |
| Comparative Example 1 | $Gd_2Zr_2O_7$ | more than $1.0 \times 10^6$ (insulating) | Present | B |

As shown in Table 1 and Table 2, in the superconductive conductor of each of Example 1 and Example 2, the non-oriented bed layer having conductivity ($3.5 \times 10^{-2}$ Ω·cm in Example 1, equal to or lower than $1.0 \times 10^{-4}$ Ω·cm in Example 2) was formed on the substrate, and adhesion of dust or the like was not observed. In contrast, in Comparative Example 1 in which the bed layer having no conductivity (higher than $1.0 \times 10^6$ Ω·cm) was formed, adhesion of dust or the like was observed.

In Comparative Example 1, the degree of in-plane orientation Δφ of the $CeO_2$ layer was equal to or larger than 4°, and it is thought that biaxial orientation was somewhat inferior in the correlating enforced biaxially oriented layer. In addition, in Comparative Example 1, the critical current Ic of the superconducting layer was less than 300 A. In contrast, in Example 1 and Example 2, the degree of in-plane orientation Δφ of the $CeO_2$ layer was smaller than 4°, which means that biaxial orientation better than that of Comparative Example 1 was obtained, and it is thus thought that excellent biaxial orientation was obtained in the correlating enforced biaxially oriented layer. Moreover, the critical current Ic of the superconducting layer was 300 A or more, and in Example 1 and Example 2, energization characteristics better than those of Comparative Example 1 was obtained.

In the superconductive conductor of each of Example 1 and Example 2, the enforced biaxially oriented layer was formed on the bed layer having conductivity by the sputtering method, an arcing signature was not observed in the enforced biaxially oriented layer, and a part of the intermediate layer of the wire rod which is peeled off was not observed. In contrast, in Comparative Example 1 using the bed layer having no conductivity, an arcing signature was observed in the enforced biaxially oriented layer formed on the bed layer, and further, a part of the intermediate layer of the wire rod which is peeled off was observed. Thus, it is thought that the superconducting layer formed on the peeled part of the intermediate layer could not obtain excellent biaxial orientation, and energization characteristics was deteriorated.

While the critical current Ic of the superconducting layer was less than 300 A in Comparative Example 1, the critical current Ic of the superconducting layer in each of Example 1 and Example 2 was 300 A or more. Example 1 and Example 2 obtained better energization characteristics than those of Comparative Example 1.

REFERENCE SIGNS LIST 10 substrate
24 bed layer
26 biaxially oriented layer
28 oriented layer
30 superconducting layer
100 sputtering device
101 sputter gun
102 assisting ion source
104 substrate transporting part
110 base material
DA deposition area

The invention claimed is:

1. A method for manufacturing a base material for a superconductive conductor, the method comprising:
   forming a non-oriented bed layer having conductivity on a substrate; and
   forming a biaxially oriented layer on the bed layer,
   wherein the bed layer comprises at least one selected from the group consisting of $LiTi_2O_4$, $ReO_3$, $LaTiO_3$, $SrCrO_3$, $LaNiO_3$, $SrIrO_3$, $BaPbO_3$, TiO, $MoO_2$, $WO_2$, $\beta$-$ReO_2$, $RuO_2$, $Pb_2Ru_2O_{7-x}$, and $Bi_2Ru_2O_{7-x}$.

2. The method of claim 1, wherein the forming of the biaxially oriented layer comprises sputtering.

3. The method of claim 1, wherein an electrical resistivity of the bed layer is equal to or lower than $10^{-1}$ Ω·cm.

4. The method of claim 3, wherein the electrical resistivity of the bed layer is equal to or lower than $10^{-2}$ Ω·cm.

5. The method of claim 3, wherein the electrical resistivity of the bed layer is equal to or higher than $10^{-6}$ Ω·cm.

6. The method of claim 1, wherein the bed layer comprises $LiTi_2O_4$.

7. The method of claim 1, wherein the biaxially oriented layer comprises MgO.

8. A method for manufacturing a superconductive conductor, the method comprising:
   manufacturing a base material by the method of claim 1; and
   forming a superconducting layer on the biaxially oriented layer.

9. The method of claim 8, further comprising forming an additional oriented layer after the forming of the biaxially oriented layer but before the forming of the superconducting layer, wherein the superconducting layer is formed on the additional oriented layer.

10. A superconductive conductor, comprising:
a substrate;
a non-oriented bed layer having conductivity, disposed on the substrate;
a biaxially oriented layer disposed on the bed layer; and
a superconducting layer disposed on the biaxially oriented layer,
wherein the bed layer comprises at least one selected from the group consisting of $LiTi_2O_4$, $ReO_3$, $LaTiO_3$, $SrCrO_3$, $LaNiO_3$, $SrIrO_3$, $BaPbO_3$, TiO, $MoO_2$, $WO_2$, $\beta$-$ReO_2$, $RuO_2$, $Pb_2Ru_2O_{7-x}$, and $Bi_2Ru_7O_{7-x}$.

11. The superconductive conductor of claim 10, wherein an electrical resistivity of the bed layer is equal to or lower than $10^{-1}$ $\Omega$·cm.

12. The superconductive conductor of claim 11, wherein the electrical resistivity of the bed layer is equal to or lower than $10^{-2}$ $\Omega$·cm.

13. The superconductive conductor of claim 11, wherein the electrical resistivity of the bed layer is equal to or higher than $10^{-6}$ $\Omega$·cm.

14. The superconductive conductor of claim 10, wherein the bed layer comprises $LiTi_2O_4$.

15. The superconductive conductor of claim 10, wherein the biaxially oriented layer comprises MgO.

16. The superconductive conductor of claim 10, further comprising an oriented layer between the biaxially oriented layer and the superconducting layer.

17. The superconductive conductor of claim 10, wherein the substrate is at least one selected from the group consisting of Cu, Ni, Ti, Mo, Nb, Ta, W, Mn, Fe, Ag, and an alloy thereof.

18. The superconductive conductor of claim 10, wherein the biaxially oriented layer comprises at least one selected from the group consisting of MgO, $CeO_2$, YSZ, and NbO.

* * * * *